US011729938B2

(12) United States Patent
Cueto et al.

(10) Patent No.: US 11,729,938 B2
(45) Date of Patent: Aug. 15, 2023

(54) VENTILATED HOUSING FOR ELECTRONIC DEVICES

(71) Applicant: Comcast Cable Communications, LLC, Philadelphia, PA (US)

(72) Inventors: Osman Cueto, Lansdale, PA (US); Sean McGinnis, Philadelphia, PA (US); Michael Jou, Philadelphia, PA (US)

(73) Assignee: Comcast Cable Communications, LLC, Philadelphia, PA (US)

( * ) Notice: Subject to any disclaimer, the term of this patent is extended or adjusted under 35 U.S.C. 154(b) by 807 days.

(21) Appl. No.: 16/562,757

(22) Filed: Sep. 6, 2019

(65) Prior Publication Data

US 2021/0072787 A1  Mar. 11, 2021

(51) Int. Cl.
*H05K 7/20* (2006.01)
*H05K 5/02* (2006.01)
*G06F 1/20* (2006.01)

(52) U.S. Cl.
CPC ............ *H05K 7/20* (2013.01); *H05K 5/0213* (2013.01); *G06F 1/20* (2013.01)

(58) Field of Classification Search
CPC .... H05K 5/0213; H05K 7/20; H05K 7/20127; H05K 7/20545; H05K 7/1427; H05K 5/0234; G06F 1/1601; G06F 1/1626; G06F 1/16; G06F 1/20; G05F 1/1601; G05F 1/20
USPC ........................................................ 454/184
See application file for complete search history.

(56) References Cited

U.S. PATENT DOCUMENTS

| 4,574,906 | A | * | 3/1986 | White | H04R 1/02 |
| | | | | | 381/189 |
| 6,085,925 | A | * | 7/2000 | Chung | H05K 5/0021 |
| | | | | | 220/23.6 |
| 6,328,612 | B1 | * | 12/2001 | Chung | H05K 5/0021 |
| | | | | | 361/732 |
| D460,443 | S | * | 7/2002 | Brunner | D14/240 |
| 6,760,218 | B2 | * | 7/2004 | Fan | H05K 5/0021 |
| | | | | | 361/679.02 |
| D523,014 | S | * | 6/2006 | Liu | D14/433 |
| D524,815 | S | * | 7/2006 | McRae | D14/240 |

(Continued)

FOREIGN PATENT DOCUMENTS

| CN | 106413308 A | * | 2/2017 | ........... H05K 5/0213 |
| GB | 2310086 A | * | 8/1997 | ........... H05K 5/0213 |
| KR | 101991714 B1 | * | 1/2019 | ......... H05K 7/20409 |

*Primary Examiner* — Edelmira Bosques
*Assistant Examiner* — Frances F. Hamilton
(74) *Attorney, Agent, or Firm* — BakerHostetler (57) ABSTRACT

A housing may comprise a first surface comprising one or more ventilation openings and a second surface comprising one or more ventilation openings. The one or more ventilation openings of the first surface may be located in a recessed groove of the first surface. The second surface may be substantially perpendicular to the first surface. The housing may enable air to flow through the one or more ventilation openings of the first surface and the one or more ventilation openings of the second surface to direct heat away from the one or more internal components of the housing. The arrangement of the one or more ventilation openings may enable one or more housings to be stacked on top of each other without impeding air flow through the one or more ventilation openings of the first surface and/or the one or more ventilation openings of the second surface.

17 Claims, 9 Drawing Sheets

(56) References Cited

U.S. PATENT DOCUMENTS

| | | | | |
|---|---|---|---|---|
| D530,325 S | * | 10/2006 | Kerila | D14/240 |
| D536,333 S | * | 2/2007 | McRae | D14/240 |
| D536,696 S | * | 2/2007 | McRae | D14/240 |
| 7,903,405 B1 | * | 3/2011 | Miller | H05K 7/20145 361/689 |
| 8,009,426 B2 | * | 8/2011 | Ahmad-Taylor | H05K 7/20127 174/547 |
| 8,189,331 B2 | * | 5/2012 | Senatori | G06F 1/203 165/104.34 |
| 8,981,218 B1 | * | 3/2015 | Kono | H05K 5/0213 439/535 |
| D730,351 S | * | 5/2015 | Lee | D14/240 |
| D745,479 S | * | 12/2015 | McManigal | D14/125 |
| D752,529 S | * | 3/2016 | Loretan | D14/125 |
| 9,436,238 B1 | * | 9/2016 | Douthit | H05K 5/0234 |
| D774,019 S | * | 12/2016 | Park | D14/216 |
| 9,752,793 B2 | * | 9/2017 | Novotny | G05D 23/1904 |
| 9,883,265 B2 | * | 1/2018 | Cheney | H04R 1/02 |
| D836,092 S | * | 12/2018 | Erbacher | D14/242 |
| 10,405,454 B2 | * | 9/2019 | Ruberto | G06F 1/20 |
| 10,638,209 B2 | * | 4/2020 | Cheney | H02J 50/10 |
| D884,707 S | * | 5/2020 | Zhang | D14/434 |
| D905,024 S | * | 12/2020 | Cueto | D14/240 |
| D905,025 S | * | 12/2020 | Cueto | D14/240 |
| D905,026 S | * | 12/2020 | Cueto | D14/240 |
| 10,869,128 B2 | * | 12/2020 | Qian | H04R 1/403 |
| D913,265 S | * | 3/2021 | Cueto | D14/240 |
| 11,218,809 B2 | * | 1/2022 | Ramones | H04R 7/16 |
| 2004/0069561 A1 | * | 4/2004 | Cox | H04R 1/02 181/148 |
| 2004/0070923 A1 | * | 4/2004 | Fan | H05K 5/0021 361/679.02 |
| 2004/0105230 A1 | * | 6/2004 | Lin | G11B 33/025 |
| 2004/0134253 A1 | * | 7/2004 | Kim | B21D 51/52 72/379.2 |
| 2005/0123165 A1 | * | 6/2005 | Yang | H04R 1/02 381/387 |
| 2006/0018094 A1 | * | 1/2006 | Robbins | H05K 7/20563 361/679.48 |
| 2007/0002846 A1 | * | 1/2007 | Rada | H04B 17/309 370/358 |
| 2011/0286613 A1 | * | 11/2011 | Lipsky | H04R 1/26 381/190 |
| 2012/0088132 A1 | * | 4/2012 | Ahn | H01M 10/6551 429/83 |
| 2012/0318756 A1 | * | 12/2012 | Elwany | H05K 7/18 211/26 |
| 2013/0335902 A1 | * | 12/2013 | Campbell | G06F 1/203 312/236 |
| 2014/0078673 A1 | * | 3/2014 | Vincent | H05K 7/2049 165/76 |
| 2014/0362522 A1 | * | 12/2014 | Degner | G06F 1/20 361/679.54 |
| 2016/0198247 A1 | * | 7/2016 | Cheney | H04R 31/006 381/334 |
| 2016/0212884 A1 | * | 7/2016 | Ruberto | G06F 1/20 |
| 2017/0132954 A1 | * | 5/2017 | Birk | B32B 38/10 |
| 2019/0021184 A1 | * | 1/2019 | Williams | G06F 1/18 |
| 2020/0112792 A1 | * | 4/2020 | Ramones | H04R 9/06 |
| 2021/0194514 A1 | * | 6/2021 | Migliorino | H01Q 1/246 |

* cited by examiner

VENTILATED HOUSING FOR ELECTRONIC DEVICES

BACKGROUND

A housing may comprise an exterior case or enclosure configured to contain one or more components (e.g., an electronic device) within the housing. The housing may prevent the one or more components from being contaminated by outside debris such as dirt and water, as well as from other physical damage. However, certain devices, particularly those contained within certain housings, may be prone to overheating. Overheating of a device may cause numerous problems, including but not limiting to damage to the one or more components, reduced battery life, and potential fire hazards. This may be particularly problematic when two or more devices are stacked on top of each other, amplifying the heat exchange between the devices and limiting the ability for heat to escape from the housing.

SUMMARY

A housing is described for one or more internal components such as an electronic device contained within the housing. The housing may comprise at least a first surface comprising one or more ventilation openings and a second surface comprising one or more ventilation openings. The one or more ventilation openings of the first surface may be located in a recessed groove of the first surface. The second surface may be substantially perpendicular to the first surface. The housing may comprise a third surface that is proximate to the second surface and is substantially parallel to the first surface. The housing may enable or facilitate air flow through the one or more ventilation openings of the first surface and the one or more ventilation openings of the second surface in order to direct heat away from the one or more internal components of the housing. The arrangement of the one or more ventilation openings may enable one or more housings to be stacked on top of each other without impeding air flow through the one or more ventilation openings of the first surface and/or the one or more ventilation openings of the second surface.

BRIEF DESCRIPTION OF THE DRAWINGS

The following detailed description is better understood when read in conjunction with the appended drawings. For the purposes of illustration, examples are shown in the drawings; however, the subject matter is not limited to specific elements and instrumentalities disclosed. In the drawings.

DETAILED DESCRIPTION OF ILLUSTRATIVE EMBODIMENTS

Disclosed herein is a housing for containing one or more internal components such as an electronic device. The housing may comprise at least a first surface comprising one or more ventilation openings and a second surface comprising one or more ventilation openings. The one or more ventilation openings of the first surface may be located in a recessed groove of the first surface. The second surface may be substantially perpendicular to the first surface. The housing may comprise a third surface that is proximate to the second surface and is substantially parallel to the first surface. The housing may enable or facilitate air flow through the one or more ventilation openings of the first surface and the one or more ventilation openings of the second surface in order to direct heat away from the one or more internal components of the housing. The arrangement of the one or more ventilation openings may enable one or more housings to be stacked on top of each other without impeding air flow through the one or more ventilation openings of the first surface and/or the one or more ventilation openings of the second surface. In one example, the device may be a gateway device. However, it is understood that the device may be any type of device capable of protection within the housing.

FIGS. 1-9 show numerous views of an example housing 100.

Figure 1:
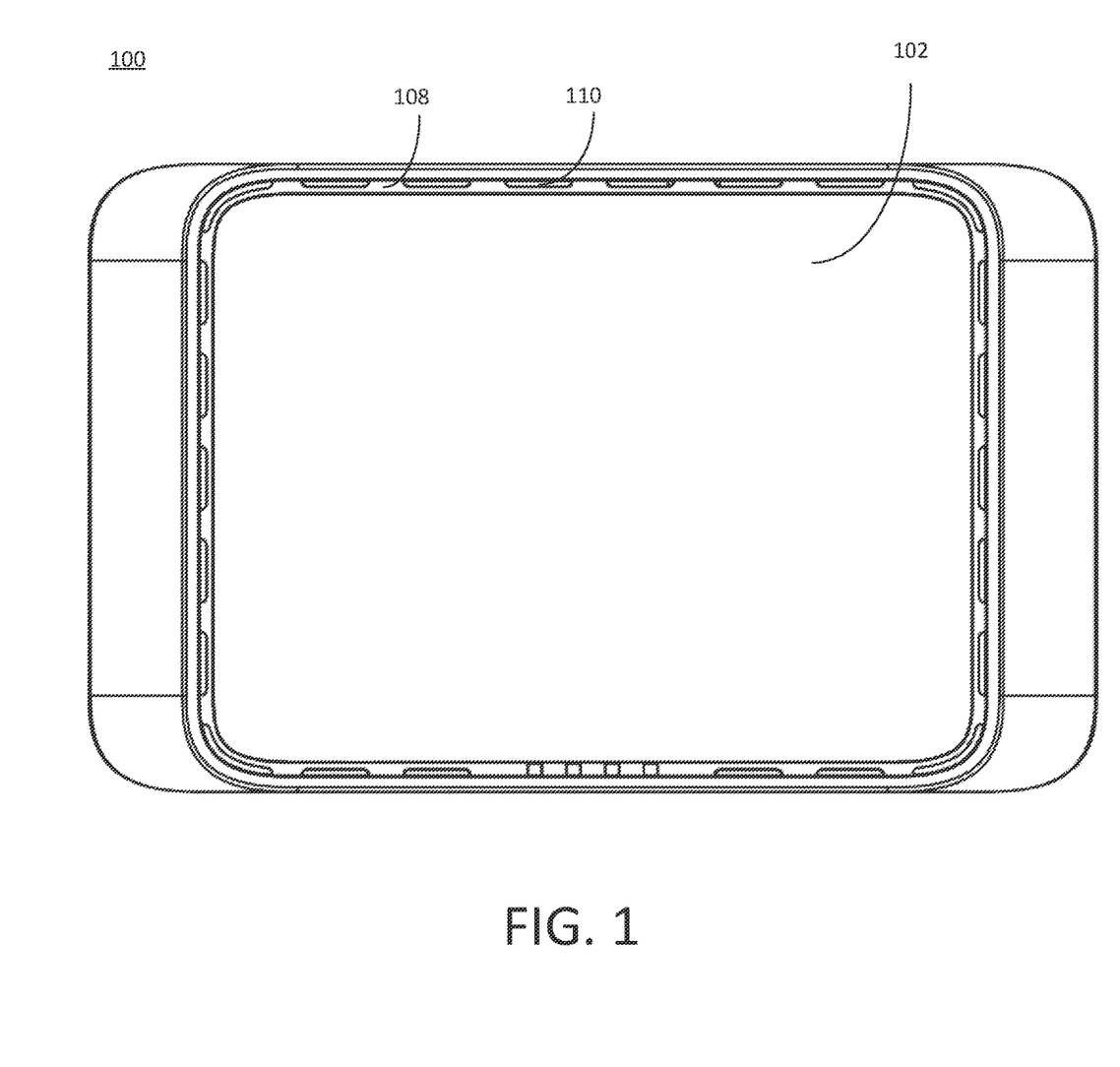
FIG. 1 shows a first view of a housing.

FIG. 1 shows a first view of the housing 100. The first view of the housing 100 may be a top view of the housing 100. The housing 100 may comprise a first surface 102. The first surface may be substantially planar. The first surface 102 may comprise a recessed groove 108. The recessed groove 108 may comprise one or more ventilation openings 110. The one or more ventilation openings 110 may enable air to flow in a direction into and/or out of the housing 100. The ventilation openings 110 may be of any size or shape that enables air to flow in a direction into and/or out of the housing 100. For example, the ventilation openings 110 may be circular, elliptical, square, rectangular, etc.

Figure 2:
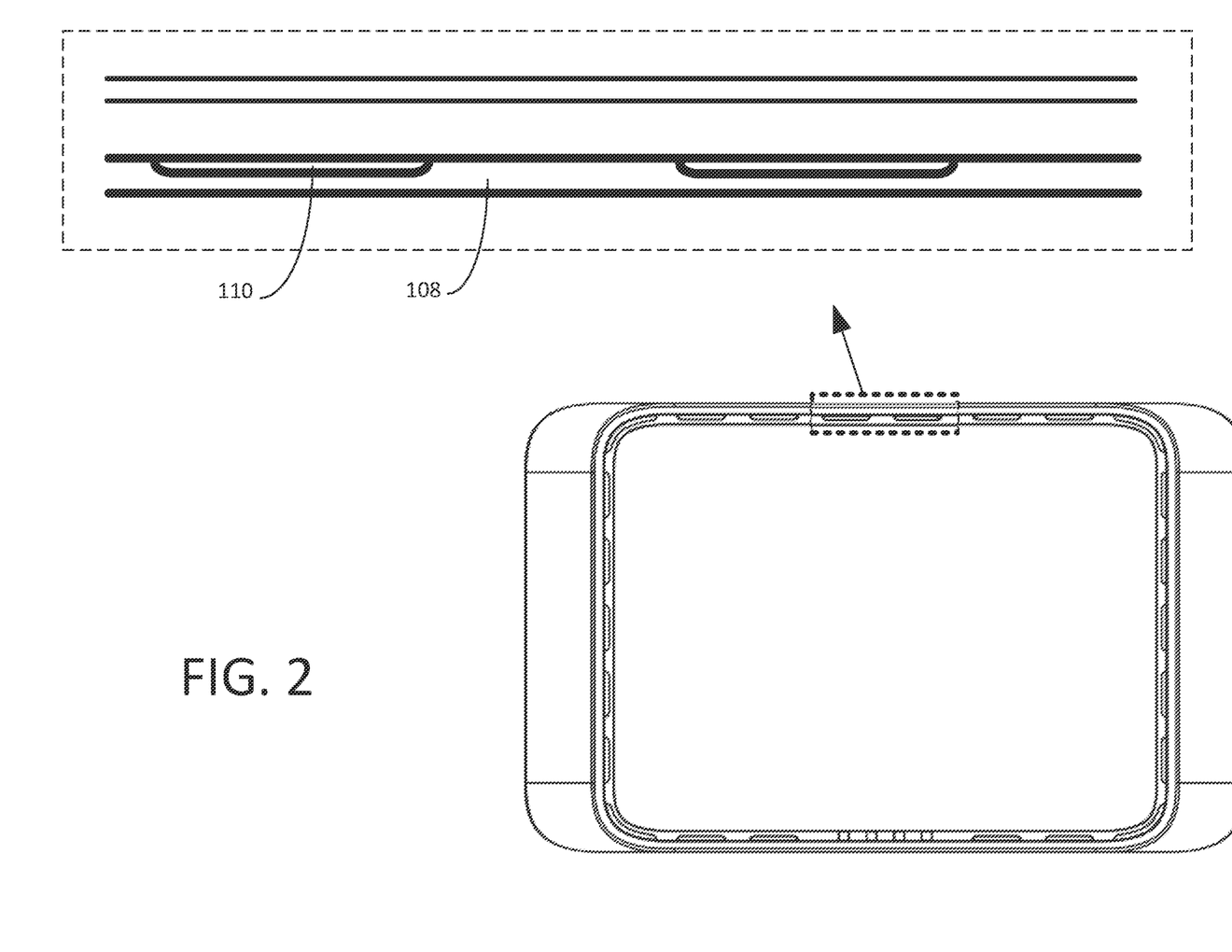
FIG. 2 shows a second view of the housing.

FIG. 2 shows a second view of the housing 100. Specifically, FIG. 2 shows more details of the recessed groove 108 and the one or more ventilation openings 110 of the first surface 102 of the housing 100. As shown in FIG. 2, the housing 100 may comprise one or more recessed grooves 108. The recessed groove 108 may be perpendicular to the first surface 102 or may intersect with the first surface 102 at an angle. The recessed groove 108 may comprise one or more ventilation openings 110. The one or more ventilation openings 110 may enable air to flow in a direction into and/or out of the housing 100.

Figure 3:
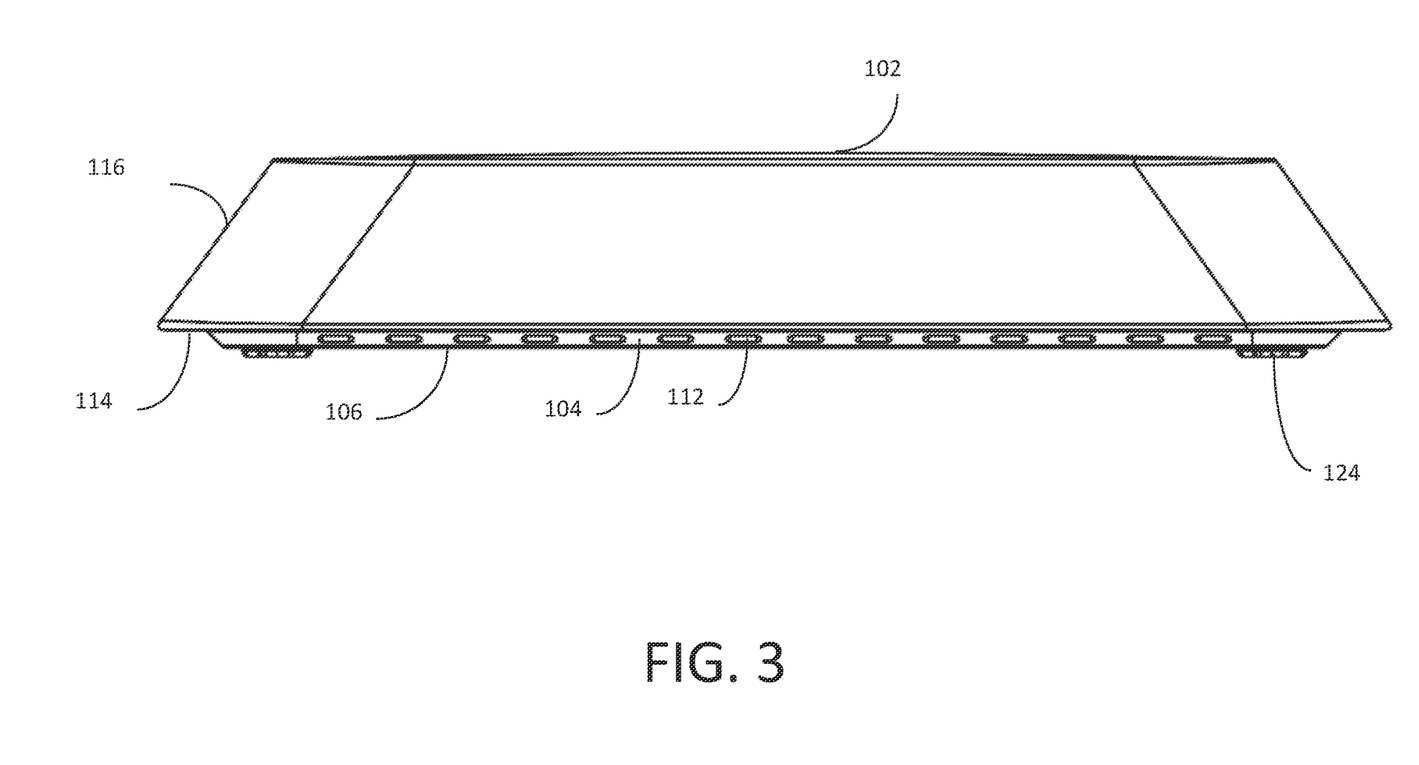
FIG. 3 shows a third view of the housing.

FIG. 3 shows a third view of the housing 100. The third view of the housing 100 may be a side view of the housing 100. The third view of the housing may be a side view of the housing 100 when the housing 100 is oriented in a horizontal direction. The third view of the housing 100 shows the first surface 102 of the housing 100, which may be the top surface of the housing 100. The side view of the housing 100 shows a second surface 104 of the housing 100. The second surface 104 of the housing 100 may be substantially perpendicular to the first surface 102 of the housing 100. The second surface 104 of the housing 100 may be a side surface of the housing 100. The second surface 104 of the housing 100 may comprise one or more ventilation openings 112. The ventilation openings 112 may enable air to flow in a direction into and/or out of the housing 100. The air flow into the one or more ventilation openings 112 may flow out of one or more of the other ventilation openings 112 and/or out of the one or more ventilation openings 110. Similarly, the air flow through the one or more ventilation openings 110 may flow out of one or more of the other ventilation openings 110 and/or out of the one or more ventilation openings 112.

The housing 100 may comprise a third surface 106. The third surface 106 may be a bottom surface of the housing 100. The third surface 106 may be substantially parallel to the first surface 102. The housing 100 may comprise a fourth surface 114. The fourth surface 114 of the housing 100 may be substantially parallel to the first surface 102 and the third surface 106. The fourth surface 114 of the housing 100 may extend outward from the second surface 104. The housing 100 may comprise a fifth surface 116. The fifth surface 116 may intersect with the first surface 102 and the second surface 104 at an angle. The housing 100 may comprise one or more supports 124 for supporting the housing 100. The supports 124 may be comprised of any material (e.g., rubber) and may be detachable from the device.

Figure 4:
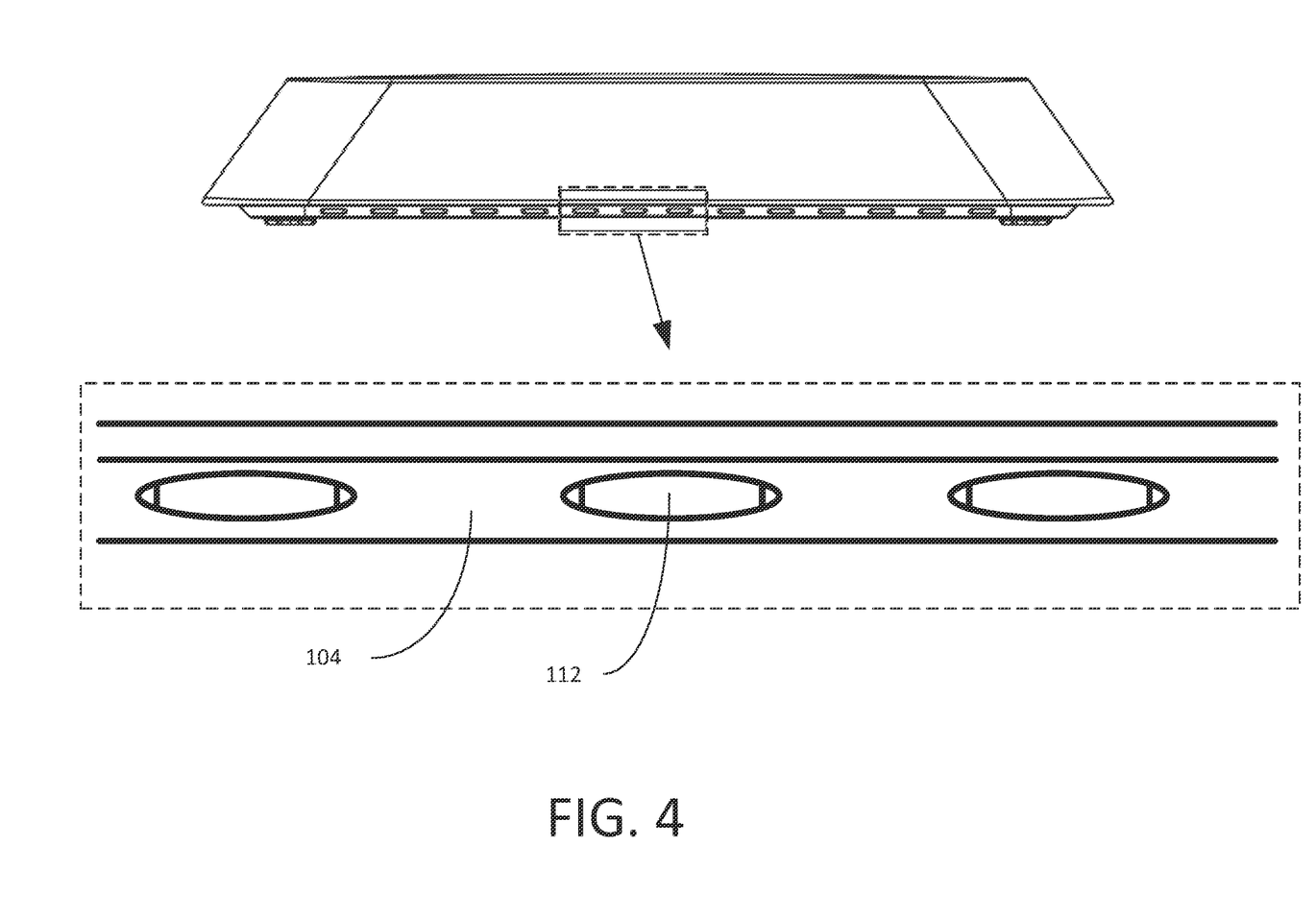
FIG. 4 shows a fourth view of the housing.

FIG. 4 shows a fourth view of the housing 100. Specifically, FIG. 4 shows more details of the second surface 104 and the one or more ventilation openings 112. The second surface 104 may be substantially perpendicular to the first surface 102. The second surface 104 may comprise any number of ventilation openings 112. The ventilation openings 112 may be of any size or shape that enables air to flow in a direction into and/or out of the device. For example, the ventilation openings 110 may be circular, elliptical, square, rectangular, etc.

Figure 5:
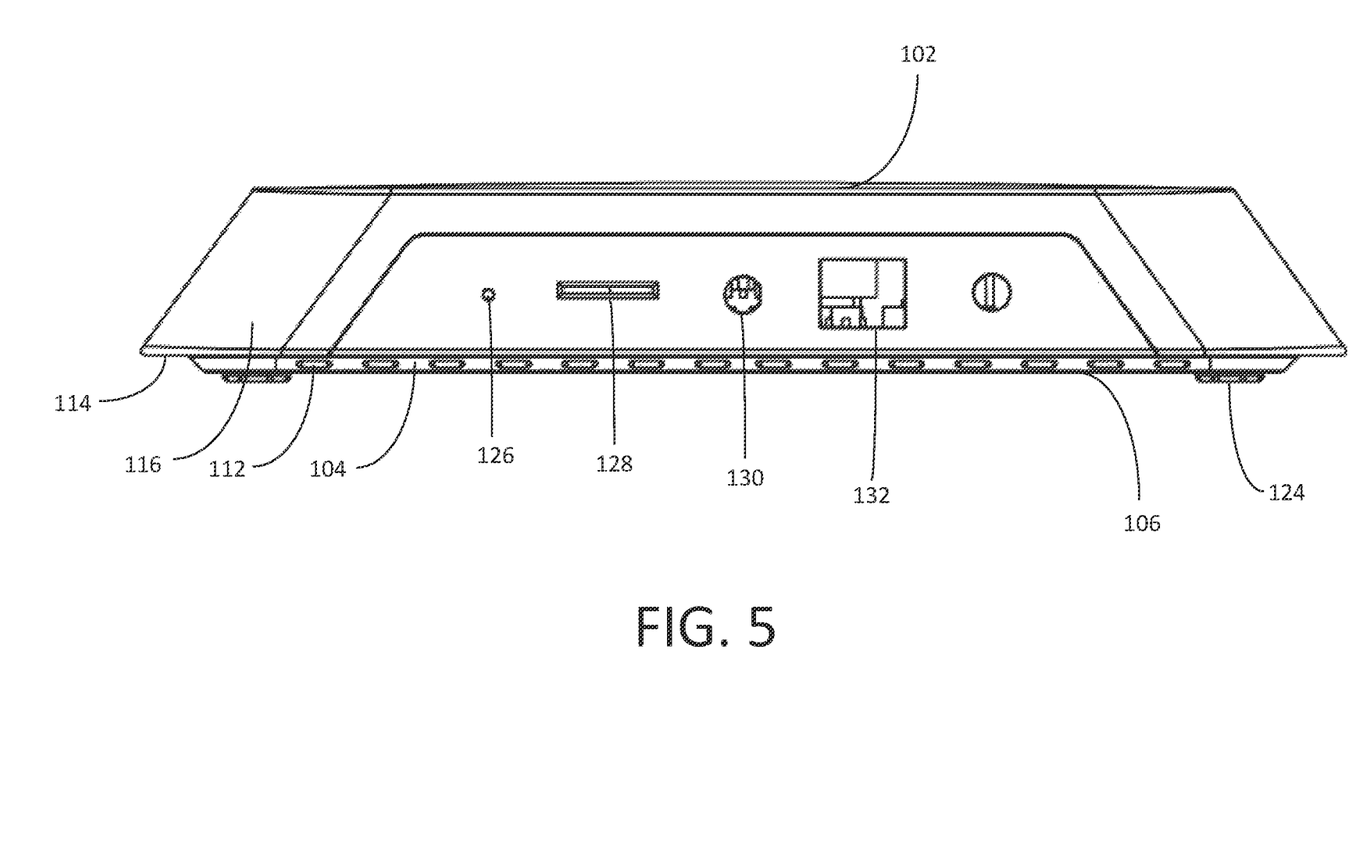
FIG. 5 shows a fifth view of the housing.

FIG. 5 shows a fifth view of the housing 100. The fifth view of the housing 100 may be a side view of the housing 100. The fifth view of the housing 100 shows the first surface 102 of the housing 100, which may be the top surface of the housing 100. The fifth view of the housing 100 shows the second surface 104 of the housing 100. The second surface 104 of the housing 100 may be a side surface of the housing 100. The second surface 104 of the housing 100 may comprise one or more ventilation openings 112. The ventilation openings 112 may enable air to flow in a direction into and/or out of the housing 100.

The third surface 106 may be a bottom portion of the housing 100. The third surface 106 may be substantially parallel to the first surface 102. The housing 100 may comprise a fourth surface 114. The fourth surface 114 of the housing 100 may be substantially parallel to the first surface 102. The fourth surface 114 of the housing 100 may extend outward from the second surface 104. The housing 100 may comprise a fifth surface 116. The fifth surface 116 may intersect with the first surface 102 and the second surface 104 at an angle. The housing 100 may comprise one or more supports 124 for supporting the housing 100. The supports 124 may be comprised of any material (e.g., rubber) and may be detachable from the device. The housing 100 may have one or more components 124, 126, 128, 130 and 132. The one or more components may include but are not limited to supports 124 (e.g., rubber feet) for lifting the gateway off the ground and reducing vibration, a pin hole 126 for a reset button, a SIM card slot 128, an antenna input 130, and an ethernet input 132.

Figure 6:
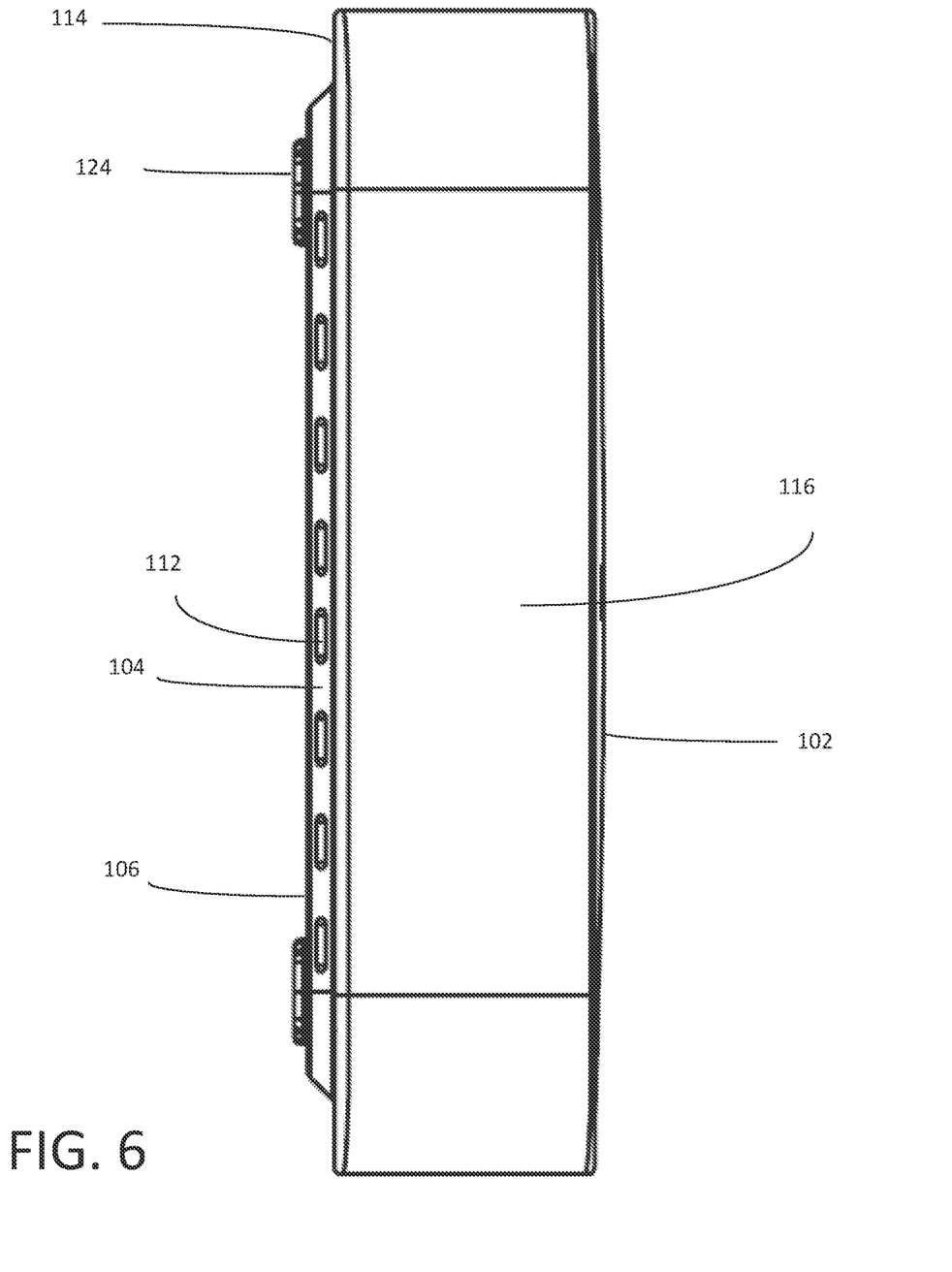
FIG. 6 shows a sixth view of the housing.

FIG. 6 shows a sixth view of the housing 100. The sixth view of the housing 100 shows the housing 100 oriented in a vertical direction. The housing 100 may be mounted vertically, such as in an example where the housing is wall mounted. In this example, the first surface 102 may be oriented in a substantially horizontal direction. The sixth view of the housing 100 may be a side view of the housing 100. The second surface 104 of the housing 100 may comprise one or more ventilation openings 112. The ventilation openings 112 may enable air to flow in a direction into and/or out of the housing 100. The housing 100 may comprise one or more supports 124 for supporting the housing 100. The supports 124 may be comprised of any material (e.g., rubber) and may be detachable from the device. The supports 124 may not be necessary when the housing 100 is oriented in the vertical direction. Additionally or alternatively, the supports 124 may be located in another location of the housing 100.

Figure 7:
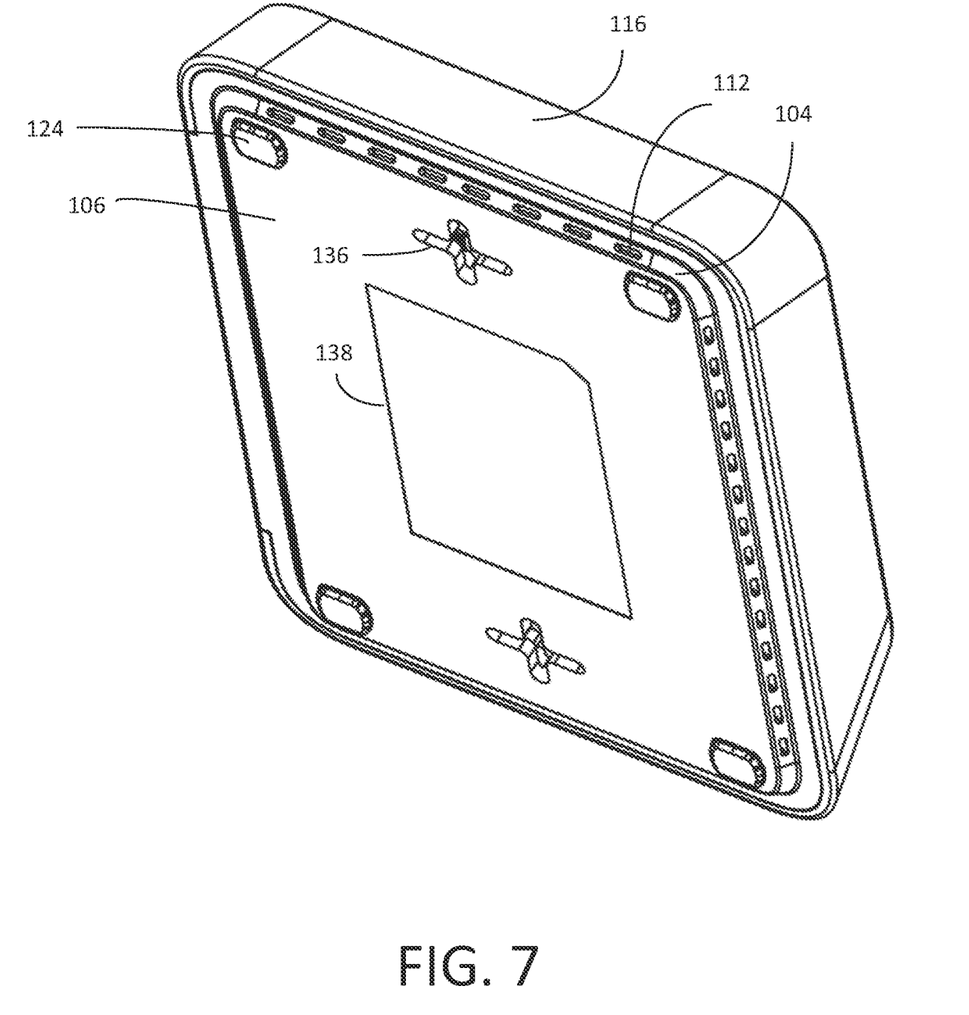
FIG. 7 shows a seventh view of the housing.

FIG. 7 shows a seventh view of the housing 100. The second surface 104 of the housing 100 may be a side surface of the housing 100. The second surface 104 of the housing 100 may comprise one or more ventilation openings 112. The ventilation openings 112 may enable air to flow in a direction into and/or out of the housing 100. The third surface 106 of the housing 100 may be a bottom surface of the housing 100. The third surface 106 of the housing 100 may comprise a wall mount 136 for the housing 100. The third surface 106 of the housing 100 may comprise a space 138 reserved for a label. The housing 100 may comprise one or more supports 124 for supporting the housing 100. The housing 100 may comprise a fifth surface 116. The fifth surface 116 may intersect with the first surface 102 and the second surface 104 at an angle.

Figure 8:
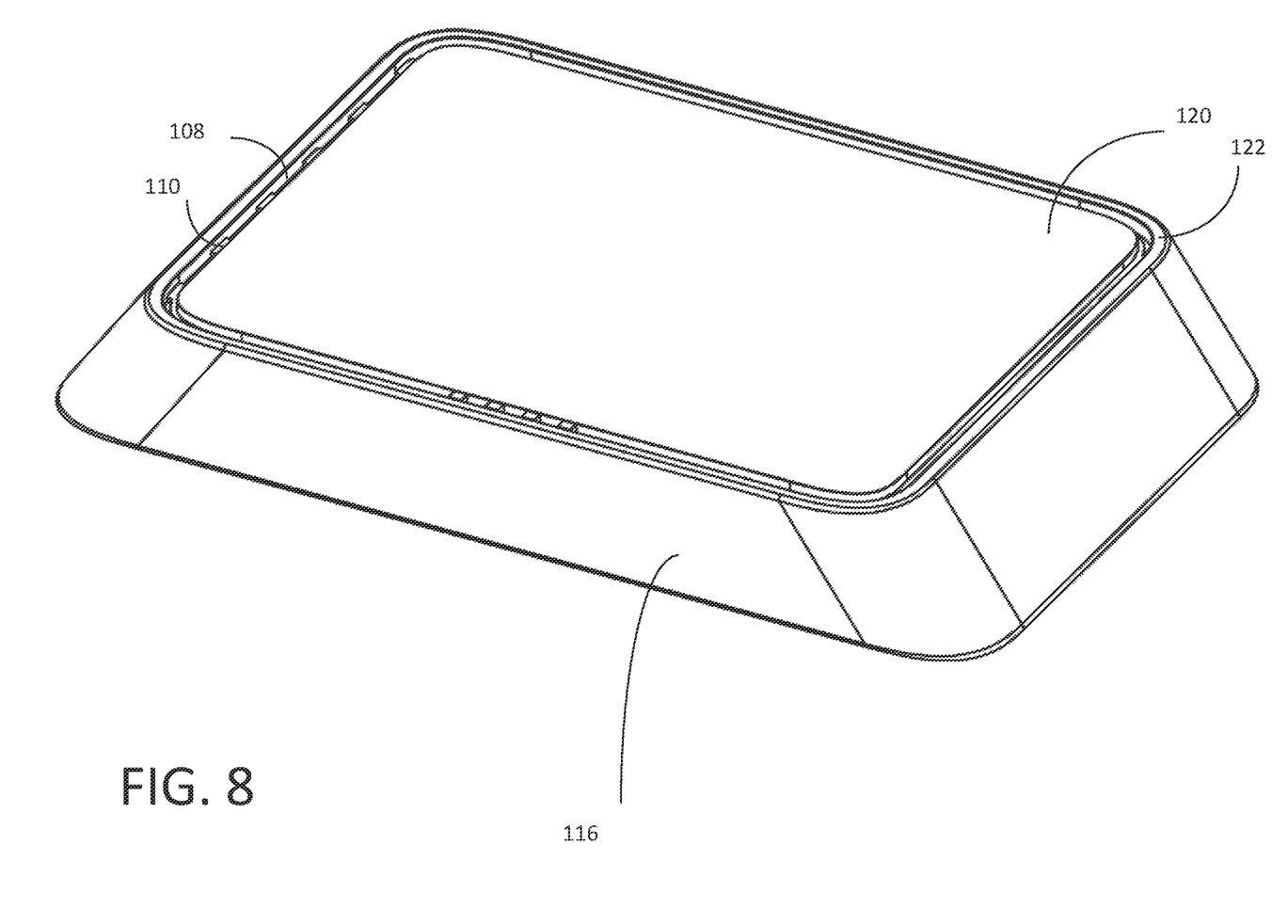
FIG. 8 shows an eight view of the housing.

FIG. 8 shows an eighth view of the housing 100. The eight view of the housing 100 may be a top view of the housing 100. The housing 100 may comprise a recessed groove 108. The recessed groove 108 may comprise one or more ventilation openings 110. The one or more ventilation openings 110 may enable air to flow in a direction into and/or out of the housing 100. The first surface 102 of the housing 100 (e.g., the top portion of the housing 102 when the housing is oriented in the horizontal direction) may comprise a first portion 120 and a second portion 122. The first portion 120 may be raised with respect to the second portion 122. The first portion 120 and the second portion 122 may be separated by the recessed groove 108. The first portion 120 being raised with respect to the second portion 122 may enable one or more other items, such as one or more other housings, to be placed on top of the housing 100 without impeding air flow through the one or more ventilation openings 110. The housing 100 may comprise a fifth surface 116. The fifth surface 116 may intersect with the first surface 102 and the second surface 104 at an angle.

Figure 9:
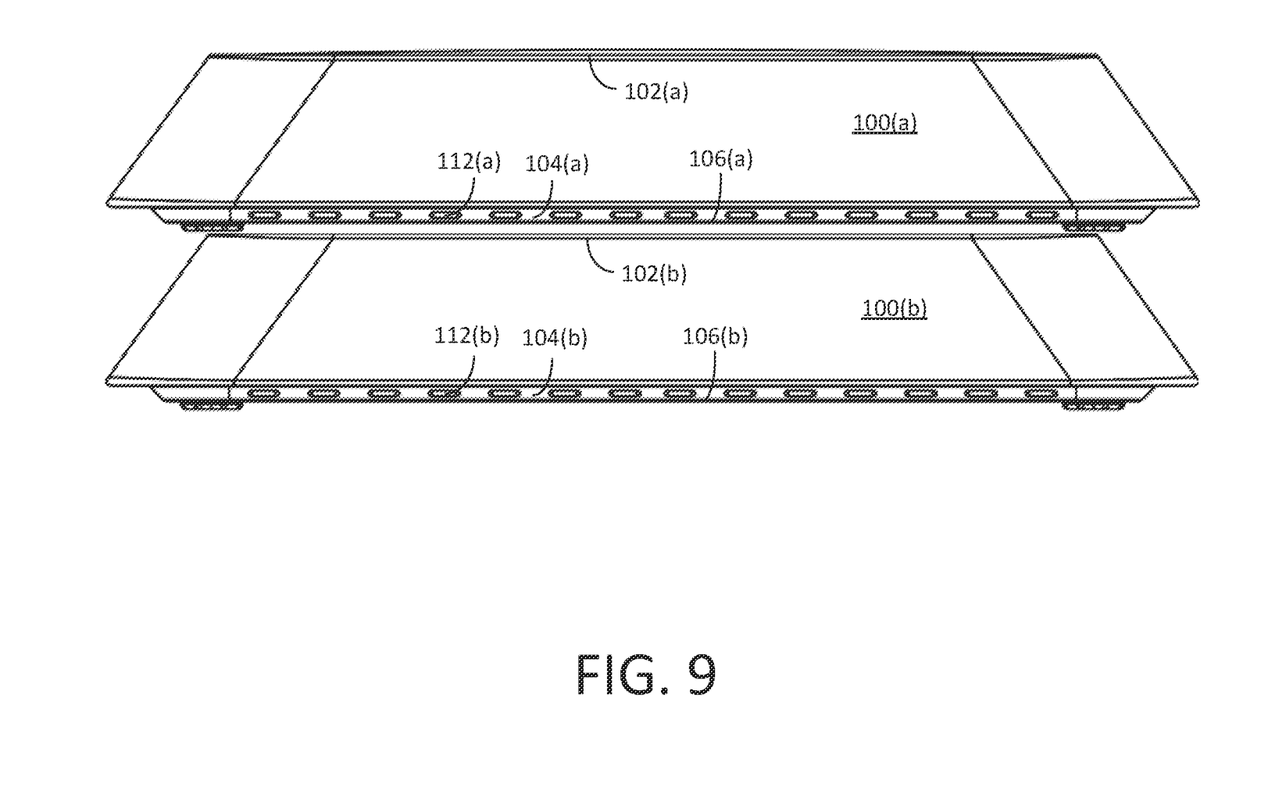
FIG. 9 shows an example system comprising two housings.

FIG. 9 shows an example system comprising a first housing 100(*a*) stacked on top of a second housing 100(*b*). The first housing 100(*a*) may comprise a first surface 102(*a*). The first surface 102(*a*) may be a top surface of the first housing 100(*a*). The first surface 102(*a*) may comprise a recessed groove 108(*a*). The recessed groove 108(*a*) may comprise one or more ventilation openings 110(*a*) that enable air to flow in a direction into and/or out of the first housing 100(*a*). The first housing 100(*a*) may comprise a second surface 104(*a*). The second surface 104(*a*) of the first housing 100(*a*) may be a side surface of the first housing 100(*a*). The second surface 104(*a*) of the first housing 100(*a*) may comprise one or more ventilation openings 112(*a*) that enable air to flow in a direction into and/or out of the first housing 100(*a*). The first housing 100(*a*) may comprise a third surface 106(*a*). The third surface 106(*a*) of the first housing 100(*a*) may be a bottom surface of the first housing 100(*a*) that may be substantially parallel to the first surface 102(*a*) of the first housing 100(*a*).

The second housing 100(*b*) may comprise a first surface 102(*b*). The first surface 102(*b*) may be a top surface of the second housing 100(*b*). The first surface 102(*b*) may comprise a recessed groove 108(*b*). The recessed groove 108(*b*) may comprise one or more ventilation openings 110(*b*) that enable air to flow in a direction into and/or out of the second housing 100(b). The second housing 100(b) may comprise a second surface 104(b). The second surface 104(b) of the second housing 100(b) may be a side surface of the second housing 100(b). The second surface 104(b) of the second housing 100(b) may comprise one or more ventilation openings 112(b) that enable air to flow in a direction into and/or out of the second housing 100(b). The second housing 100(b) may comprise a third surface 106(b). The third surface 106(b) of the second housing 100(b) may be a bottom surface of the second housing 100(b) that may be substantially parallel to the first surface 102(b) of the second housing 100(b).

As shown in FIG. 9, the first housing 100(a) and the second housing 100(b) may be configured such that stacking at least one of the first housing 100(a) and the second housing 100(b) on top of the other one of the first housing 100(a) and the second housing 100(b) may not restrict air flow through the one or more ventilation openings 110(a) and 110(b) of the first surface or the one or more ventilation openings 112(a) and 112(b) of the second surface. As shown in FIG. 8, the first surface 110(a), 110(b) may comprise a first portion and a second portion (such as the first portion 120 and the second portion 122). The first portion may be raised with respect to the second portion such that a first housing may be stacked on top of a second housing without impeding air flow through the one or more ventilation openings 110(a), 110(b). It is understood that while FIG. 9 shows a first housing 100(a) stacked on top of a second housing 100(b), the housing may be configured such that any object may be placed on top of the housing without impeding air flow through the one or more ventilation openings of the first surface or the second surface.

The second surface 104 of the housing 100 may form a recessed portion of the fifth surface 116 of the housing 100. The second surface 104 may be proximate to the third surface 106 of the housing 100. In the example of FIG. 9, the ventilation openings 112(a) of the second surface 104(a) of the first housing 100(a) may be positioned proximate to the ventilation openings 110(b) of the first surface 102(b) of the second housing 100(b). The second surface 104 of the housing 100 may separate the third surface 106 from the fourth surface 114. This may reduce the footprint of the third surface 106 so that when one housing is stacked on top of another (e.g., housing 100(a) on top of housing 100(b)), the bottom surface 106(a) of the housing 100(a) would not obstruct the recessed groove 108(a) and the ventilation openings 110(b) of the top surface 102(b) of the housing 100(b).

An example housing may comprise a first surface comprising one or more ventilation openings and a second surface comprising one or more other ventilation openings. The housing may be the housing 100 shown in any of FIGS. 1-9. The first surface may be the surface 102. The second surface may be the second surface 104. The second surface may be substantially perpendicular to the first surface. The one or more ventilation openings of the first surface may be the ventilation openings 110. The one or more ventilation openings of the second surface may be the ventilation openings 112. The one or more ventilation openings of the first surface may be located in a recessed groove of the first surface. The recessed groove may be the recessed groove 108. The housing may comprise a third surface that is proximate to the second surface and this is substantially parallel to the first surface. The third surface may be the surface 106. The first surface may be a top surface of the housing. The second surface may be a side surface of the housing. The third surface may be a bottom surface of the housing.

The housing may comprise one or more internal components, such as an electronic device. The one or more ventilation openings and the one or more other ventilation openings may be arranged such that one or more internal components of the housing are not visible through the one or more ventilation openings and the one or more other ventilation openings.

The one or more ventilation openings and the one or more other ventilation openings may be arranged to enable stacking of the housing and one or more other housings without impeding air flow through the one or more ventilation openings and the one or more other ventilation openings. The first surface of the housing may comprise a first portion and a second portion, such as the first portion 120 and the second portion 122 shown in FIG. 8. The first portion and the second portion of the first surface may be separated by the recessed groove. The first portion of the first surface may be raised with respect to the second portion of the first surface.

The housing may comprise a fourth surface that is substantially parallel to the first surface. The fourth surface may be the surface 114. The fourth surface may extend outward from the second surface of the housing. The fourth surface of the housing may have a width that is greater than a width of the first surface and the third surface, such as the fourth surface 114 shown in FIG. 3. The housing may comprise a fifth surface that connects the first surface and the fourth surface. The fifth surface of the housing may be the surface 116. The fifth surface may be angled with respect to the first surface and the fourth surface.

The first surface of the housing may be located on a first portion of the housing and the second surface of the housing may be located on a second portion of the housing. The first portion of the housing may be separable from the second portion of the housing. The one or more ventilation openings may be located on the first portion of the housing and the one or more other ventilation openings may be located on the second portion of the housing.

A housing may comprise a top surface comprising one or more ventilation openings and a side surface comprising one or more ventilation openings. The housing may be the housing 100 shown in FIGS. 1-9. The top surface of the housing may be the surface 102. The side surface of the housing may be the surface 104. The one or more ventilation openings of the top surface may be the one or more ventilation openings 110. The one or more ventilation openings 110 may be located in a recessed groove of the top surface, such as the recessed groove 108. The one or more ventilation openings of the side surface may be the ventilation openings 112. The side surface may be substantially perpendicular to the top surface.

The one or more ventilation openings of the top surface and the one or more ventilation openings of the side surface may be arranged to enable stacking of the housing and one or more other housings without impeding air flow through the one or more ventilation openings of the top surface and the one or more ventilation openings of the side surface. The top surface of the housing may comprise a first portion and a second portion, such as the first portion 120 and the second portion 122 shown in FIG. 8. The first portion and the second portion of the top surface may be separated by the recessed groove. The first portion of the top surface may be raised with respect to the second portion of the top surface.

An example system may comprise a first housing and a second housing. The first housing may be the housing 100(a) shown in FIG. 9. The first housing may comprise a top surface comprising one or more ventilation openings and a side surface comprising one or more ventilation openings. The top surface of the housing may be the surface 102(a). The side surface of the housing may be the surface 104(a). The one or more ventilation openings of the top surface may be the one or more ventilation openings 110(a). The one or more ventilation openings 110 may be located in a recessed groove of the top surface, such as the recessed groove 108(a). The one or more ventilation openings of the side surface may be the ventilation openings 112(a). The side surface may be substantially perpendicular to the top surface.

The second housing may be the housing 100(b) shown in FIG. 9. The second housing may comprise a top surface comprising one or more ventilation openings and a side surface comprising one or more ventilation openings. The top surface of the housing may be the surface 102(b). The side surface of the housing may be the surface 104(b). The one or more ventilation openings of the top surface may be the one or more ventilation openings 110(b). The one or more ventilation openings 110 may be located in a recessed groove of the top surface, such as the recessed groove 108(b). The one or more ventilation openings of the side surface may be the ventilation openings 112(b). The side surface may be substantially perpendicular to the top surface.

The first housing and the second housing may be configured such that stacking at least one of the first housing and the second housing on top of the other one of the first housing and the second housing may not restrict air flow through the one or more ventilation openings and of the first surface or the one or more ventilation openings and of the second surface. The first surface may comprise a first portion and a second portion (such as the first portion 120 and the second portion 122). The first portion may be raised with respect to the second portion such that a first housing (or other object) may be stacked on top of a second housing without impeding air flow through the one or more ventilation openings.

While the methods and systems have been described in connection with preferred embodiments and specific examples, it is not intended that the scope be limited to the particular embodiments set forth, as the embodiments herein are intended in all respects to be illustrative rather than restrictive.

It will be apparent to those skilled in the art that various modifications and variations may be made without departing from the scope or spirit of the present disclosure. Other embodiments will be apparent to those skilled in the art from consideration of the specification and practices described herein. It is intended that the specification and example figures be considered as example only, with a true scope and spirit being indicated by the following claims.

What is claimed:

1. A housing comprising:
a first surface comprising one or more ventilation openings located in a recessed groove of the first surface;
a second surface comprising one or more other ventilation openings, wherein the second surface is substantially perpendicular to the first surface; and
a third surface that is proximate to the second surface and is substantially parallel to the first surface, wherein the one or more ventilation openings and the one or more other ventilation openings are arranged to enable stacking of the housing and one or more other housings without impeding air flow through the one or more ventilation openings and the one or more other ventilation openings.

2. The housing of claim 1, wherein:
the first surface is a top surface of the housing;
the second surface is a side surface of the housing; and
the third surface is a bottom surface of the housing.

3. The housing of claim 1, wherein the housing comprises one or more internal components.

4. The housing of claim 3, wherein the one or more ventilation openings and the one or more other ventilation openings are arranged such that one or more internal components of the housing are not visible through the one or more ventilation openings and the one or more other ventilation openings.

5. The housing of claim 1, wherein the first surface comprises a first portion and a second portion that are separated by the recessed groove.

6. The housing of claim 5, wherein the first portion of the first surface is raised with respect to the second portion of the first surface.

7. The housing of claim 1, further comprising:
a fourth surface that is substantially parallel to the first surface and that extends outward from the second surface of the housing.

8. The housing of claim 7, wherein the fourth surface of the housing has a width that is greater than a width of the first surface and the third surface.

9. The housing of claim 8, further comprising:
a fifth surface that connects the first surface and the fourth surface, wherein the fifth surface is angled with respect to the first surface and the fourth surface.

10. The housing of claim 1, wherein the first surface is located on a first portion of the housing and the second surface is located on a second portion of the housing.

11. The housing of claim 1, wherein the one or more ventilation openings are located on the first portion of the housing and the one or more other ventilation openings are located on the second portion of the housing.

12. A housing comprising:
a top surface comprising one or more ventilation openings located in a recessed groove of the top surface; and
a side surface comprising one or more other ventilation openings, wherein the side surface is substantially perpendicular to the top surface, wherein the one or more ventilation openings and the one or more other ventilation openings are arranged to enable stacking of the housing and one or more housings without impeding air flow through the one or more ventilation openings and the one or more other ventilation openings.

13. The housing of claim 12, wherein the top surface of the housing comprises a first portion and a second portion that are separated by the recessed groove.

14. The housing of claim 13, wherein the first portion of the top surface is raised with respect to the second portion of the top surface.

15. A system comprising:
a first housing comprising:
a top surface comprising one or more ventilation openings located in a recessed groove of the top surface; and
a side surface comprising one or more other ventilation openings, wherein the side surface is substantially perpendicular to the top surface; and a second housing comprising:
- a top surface comprising one or more ventilation openings located in a recessed groove of the top surface; and
- a side surface comprising one or more other ventilation openings, wherein the side surface is substantially perpendicular to the top surface, wherein one of the first housing or the second housing is stacked on the other one of the first housing or the second housing, and wherein the stacking of the one of the first housing or the second housing on the other one of the first housing or the second housing does not impede air flow through the first housing or the second housing.

16. The system of claim 15, wherein:

the top surface of the first housing comprises a first portion and a second portion that are separated by the recessed groove; and the top surface of the second housing comprises a first portion and a second portion that are separated by the recessed groove.

17. The system of claim 16, wherein:

the first portion of the top surface of the first housing is raised with respect to the second portion of the top surface of the first housing; and the first portion of the top surface of the second housing is raised with respect to the second portion of the top surface of the second housing.

\* \* \* \* \*